(12) United States Patent
Ishikawa et al.

(10) Patent No.: US 9,236,893 B2
(45) Date of Patent: Jan. 12, 2016

(54) DISTORTION COMPENSATION DEVICE AND DISTORTION COMPENSATION METHOD

(71) Applicant: FUJITSU LIMITED, Kawasaki-shi, Kanagawa (JP)

(72) Inventors: Hiroyoshi Ishikawa, Kawasaki (JP); Kazuo Nagatani, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/682,861

(22) Filed: Apr. 9, 2015

(65) Prior Publication Data

US 2015/0341060 A1 Nov. 26, 2015

(30) Foreign Application Priority Data

May 21, 2014 (JP) ................................. 2014-105624

(51) Int. Cl.
- *H04B 1/04* (2006.01)
- *H04L 5/00* (2006.01)
- *H04B 15/00* (2006.01)

(52) U.S. Cl.
CPC ............... *H04B 1/0475* (2013.01); *H04B 1/04* (2013.01); *H04B 15/00* (2013.01); *H04L 5/0048* (2013.01); *H04B 2001/0408* (2013.01); *H04B 2001/0433* (2013.01)

(58) Field of Classification Search
CPC .... H04L 27/367; H04L 5/0048; H04B 15/00; H04B 1/0475; H04B 1/04; H04B 2001/0433; H04B 2001/0408
See application file for complete search history.

(56) References Cited

U.S. PATENT DOCUMENTS

| | | | |
|---|---|---|---|
| 5,561,424 A | 10/1996 | Norsworthy et al. | |
| 7,496,152 B2 | 2/2009 | Nagatani et al. | |
| 7,551,905 B2* | 6/2009 | Kubo | H03F 1/3247 330/149 |
| 8,014,443 B2 | 9/2011 | Nakamura et al. | |
| 8,364,101 B2* | 1/2013 | Shizawa | H03F 1/0222 375/297 |
| 8,442,157 B2* | 5/2013 | Ishikawa | H04L 27/2337 375/219 |
| 8,619,905 B2* | 12/2013 | Ishikawa | H03F 1/3247 375/259 |
| 2001/0005402 A1* | 6/2001 | Nagatani | H03F 1/3247 375/296 |
| 2002/0193087 A1* | 12/2002 | Kim | H03F 1/3247 455/127.1 |
| 2006/0262880 A1 | 11/2006 | Mizuta et al. | |
| 2008/0192957 A1 | 8/2008 | Kubo | |
| 2008/0212791 A1 | 9/2008 | Asada et al. | |
| 2010/0311361 A1* | 12/2010 | Rashev | H04L 25/03063 455/114.3 |
| 2011/0063026 A1* | 3/2011 | Jung | H03F 1/0266 330/149 |
| 2011/0293051 A1* | 12/2011 | Lozhkin | H04L 25/03038 375/346 |

FOREIGN PATENT DOCUMENTS

| | | |
|---|---|---|
| JP | 06-350403 | 12/1994 |
| JP | 2000-244777 | 9/2000 |
| JP | 2002-152289 | 5/2002 |
| JP | 2005-346759 | 12/2005 |
| JP | 2006-295440 | 10/2006 |

(Continued)

*Primary Examiner* — Jean B Corrielus
(74) *Attorney, Agent, or Firm* — Fujitsu Patent Center

(57) ABSTRACT

A distortion compensation device which compensates for a distortion of an amplifier includes an FIR filter, a calculation unit that calculates an error between a reference signal and a feedback signal from the amplifier, an update unit that updates a coefficient set to the FIR filter on the basis of the error, and a delay unit that, on the basis of a magnitude of the coefficient, delays the feedback signal while controlling a delay of the feedback signal with respect to the reference signal.

4 Claims, 7 Drawing Sheets

(56) References Cited

FOREIGN PATENT DOCUMENTS

| | | |
|---|---|---|
| JP | 2006-352852 | 12/2006 |
| JP | 2008-197284 | 8/2008 |
| JP | 2008-197438 | 8/2008 |
| JP | 2008-250270 | 10/2008 |
| JP | 2009-260489 | 11/2009 |
| JP | 2011-044798 | 3/2011 |
| WO | 03103164 | 12/2003 |
| WO | 2007046370 | 4/2007 |

* cited by examiner

DISTORTION COMPENSATION DEVICE AND DISTORTION COMPENSATION METHOD

CROSS-REFERENCE TO RELATED APPLICATION

This application is based upon and claims the benefit of priority of the prior Japanese Patent Application No. 2014-105624, filed on May 21, 2014, the entire contents of which are incorporated herein by reference.

FIELD

The embodiments discussed herein are related to a distortion compensation device and a distortion compensation method.

BACKGROUND

A wireless transmission apparatus in a wireless communication system includes an amplifier which amplifies power of a transmission signal. The amplifier in the wireless transmission apparatus is typically operated near saturation in order to increase power efficiency of the amplifier. However, a non-linear distortion is increased when the amplifier is operated near saturation. Now, in order to reduce the non-linear distortion and decrease an adjacent channel leakage ratio (ACLR), the wireless transmission apparatus includes a distortion compensation device which compensates for the non-linear distortion.

A predistortion (hereinafter referred to as "PD" in some cases) method is a distortion compensation method employed by the distortion compensation device. The distortion compensation device employing the PD method multiplies in advance a transmission signal before being input to the amplifier by a distortion compensation coefficient having an inverse characteristic of the non-linear distortion of the amplifier, thereby increasing the linearity of an output of the amplifier and inhibiting a distortion in the output of the amplifier. A signal generated after multiplying the transmission signal by the distortion compensation coefficient is sometimes called a "predistortion signal (PD signal)". Accordingly, the PD signal is a signal that is distorted in advance according to the inverse characteristic of the non-linear distortion of the amplifier before being input thereto.

It is also known that a phenomenon called a memory effect is generated in the amplifier having high power efficiency. The memory effect is the phenomenon where an output of an input to the amplifier at a certain time is affected by a past input. The memory effect includes an electrical memory effect caused by an electrical transient response of the amplifier and a thermal memory effect caused by a thermal characteristic of the amplifier. In order to compensate for the memory effect of the amplifier as well as the non-linear distortion thereof, there is provided a distortion compensation device which generates the PD signal by using an FIR (Finite Impulse Response) filter. The FIR filter includes a plurality of taps. The FIR filter generates the PD signal by multiplying an input signal, a signal generated by delaying the input signal by a predetermined number of samples, and a distortion compensation coefficient serving as a tap coefficient in each of the plurality of taps and adding a plurality of multiplication results in the plurality of taps.

Related-art examples are described, for example, in Japanese Laid-open Patent Publication No. 06-350403, Japanese Laid-open Patent Publication No. 2008-250270, Japanese Laid-open Patent Publication No. 2008-197438, International Publication Pamphlet No. WO 2003/103164, Japanese Laid-open Patent Publication No. 2006-295440, Japanese Laid-open Patent Publication No. 2009-260489, International Publication Pamphlet No. WO 2007/046370, Japanese Laid-open Patent Publication No. 2006-352852, Japanese Laid-open Patent Publication No. 2008-197284, Japanese Laid-open Patent Publication No. 2000-244777, Japanese Laid-open Patent Publication No. 2002-152289, Japanese Laid-open Patent Publication No. 2005-346759, and Japanese Laid-open Patent Publication No. 2011-044798.

In the distortion compensation device using the FIR filter in the related art, the number of bits enough to be able to express a sufficiently large distortion compensation coefficient is assigned in advance to each distortion compensation coefficient in order to be able to perform compensation even when the amount of distortion increases. That is, the number of bits enough to be able to express a sufficiently large value is assigned in advance to all the distortion compensation coefficients because it is difficult to predict a value of the plurality of distortion compensation coefficients corresponding to the plurality of taps for the FIR filter adaptively performing the distortion compensation. Therefore, a problem with the distortion compensation device using the FIR filter in the related art is that a circuit is increased in scale.

SUMMARY

According to an aspect of an embodiment, A distortion compensation device which compensates for a distortion of an amplifier includes an FIR filter, a calculation unit that calculates an error between a reference signal and a feedback signal from the amplifier, an update unit that updates a coefficient set to the FIR filter on the basis of the error, and a delay unit that, on the basis of a magnitude of the coefficient, delays the feedback signal while controlling a delay of the feedback signal with respect to the reference signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
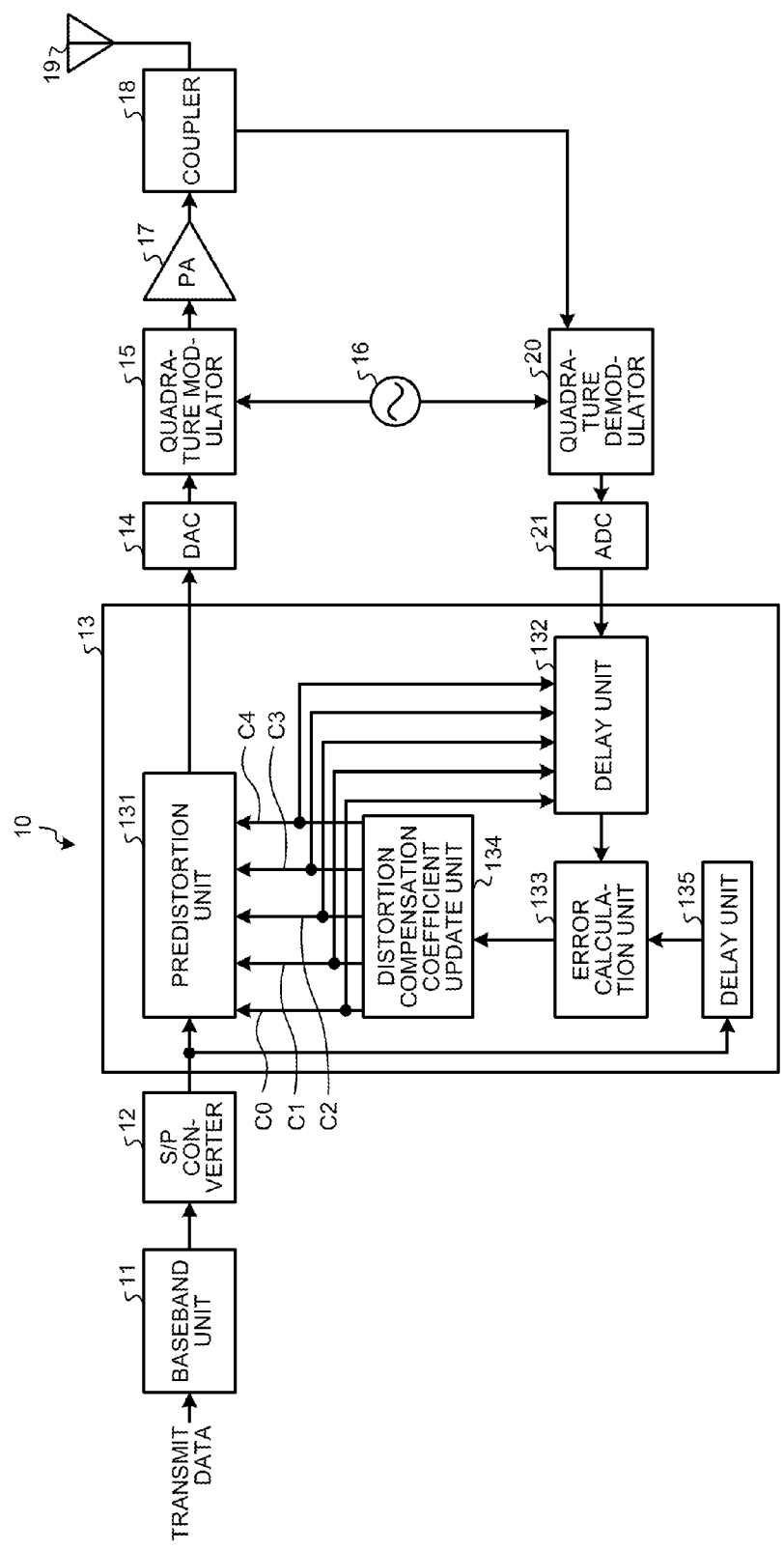
FIG. 1 is a block diagram illustrating an example of a configuration of a wireless transmission apparatus according to a first embodiment.

Preferred embodiments of the present invention will be explained with reference to accompanying drawings. Note that the distortion compensation device and the distortion compensation method disclosed in the present application are not to be limited by the embodiments described herein. A component having the same function as well as a step performing the same processing in each of the embodiments will be assigned the same reference numeral to omit redundant description.

[a] First Embodiment

<Example of Configuration of Wireless Transmission Apparatus>

FIG. 1 is a block diagram illustrating an example of a configuration of a wireless transmission apparatus according to a first embodiment. As illustrated in FIG. 1, a wireless transmission apparatus 10 includes a baseband unit 11, an S/P converter 12, a distortion compensation device 13, a DAC 14, a quadrature modulator 15, a carrier wave generator 16, an amplifier (PA: Power Amplifier) 17, a coupler 18, and an antenna 19. The wireless transmission apparatus 10 further includes a quadrature demodulator 20 and an ADC 21.

The distortion compensation device 13 employing a PD method includes a predistortion unit 131, a delay unit 132, an error calculation unit 133, a distortion compensation coefficient update unit 134, and a delay unit 135.

The wireless transmission apparatus 10 is installed in wireless communication terminal equipment or wireless communication base station equipment used in a wireless communication system, for example.

The baseband unit 11 performs baseband processing such as encoding and modulation on input transmit data to generate a transmission signal of the baseband, and outputs the generated transmission signal to the S/P converter 12.

The S/P converter 12 converts the transmission signal that is input from the baseband unit 11 into two groups including an in-phase component (I signal: In-Phase component) and a quadrature component (Q signal: Quadrature component) by alternately assigning the signal one bit at a time. The S/P converter 12 outputs in parallel the I signal and the Q signal to the predistortion unit 131 and the delay unit 135.

The predistortion unit 131 multiplies each of the I signal and the Q signal by distortion compensation coefficients (hereinafter abbreviated as "coefficients" in some cases) C0 to C4 each being a tap coefficient that is updated successively by the distortion compensation coefficient update unit 134. The predistortion unit 131 then adds all results of multiplication by the coefficients C0 to C4 for each of the I signal and the Q signal and generates a PD signal (I signal, Q signal). The predistortion unit 131 outputs the generated PD signal to the DAC 14. The coefficients C0 to C4 successively updated by the distortion compensation coefficient update unit 134 are also input to the delay unit 132. The configuration of the predistortion unit 131 will be described later.

The DAC 14 performs digital-to-analog conversion on the PD signal of each of the I signal and the Q signal and outputs the signal to the quadrature modulator 15.

The carrier wave generator 16 generates a reference carrier wave and outputs the generated reference carrier wave to the quadrature modulator 15 and the quadrature demodulator 20.

The quadrature modulator 15 multiplies the I signal of the PD signal by the reference carrier wave and multiplies the Q signal of the PD signal by a carrier wave, the phase of which is shifted by 90° from the reference carrier wave. The quadrature modulator 15 then performs quadrature modulation and up-conversion on the PD signal by adding the multiplication results together and outputs, to the amplifier 17, the PD signal after being subjected to the quadrature modulation and up-conversion.

The amplifier 17 amplifies the power of the PD signal input from the quadrature modulator 15 and outputs the power amplified signal to the coupler 18.

The coupler 18 distributes the power amplified signal to the antenna 19 and the quadrature demodulator 20. As a result, the signal output from the amplifier 17 is fed back to the distortion compensation device 13 through the quadrature demodulator 20 and the ADC 21.

The antenna 19 transmits the power amplified signal.

The quadrature demodulator 20 multiplies the signal input from the coupler 18 by each of the reference carrier wave generated by the carrier wave generator 16 and the carrier wave, the phase of which is shifter by 90° from the reference carrier wave, and performs down-conversion and quadrature demodulation. The quadrature demodulator 20 outputs, to the ADC 21, a feedback signal of each of the I signal and Q signal acquired by the quadrature demodulation.

The ADC 21 performs analog-to-digital conversion on the feedback signal and outputs the signal to the delay unit 132.

The delay unit 132 delays the feedback signal on the basis of the magnitude of the coefficients C0 to C4 and outputs the delayed feedback signal to the error calculation unit 133. Here, "d1" represents a total amount of processing delay in the predistortion unit 131, the DAC 14, the quadrature modulator 15, the amplifier 17, the coupler 18, the quadrature demodulator 20 and the ADC 21. Moreover, "d2" represents a reference value of the amount of delay in the delay unit 132. The delay unit 132 changes the amount of delay of the feedback signal to "d2'" by increasing or decreasing "d2" by a certain amount on the basis of the magnitude of the coefficients C0 to C4.

The delay unit 135 delays the transmission signal (an input signal to the predistortion unit 131) input from the S/P converter 12 by an amount of delay D, and outputs the delayed transmission signal to the error calculation unit 133 as a reference signal. In other words, the reference signal is a signal generated by delaying the transmission signal by the amount of delay D. The amount of delay D is found by D=d1+d2 and is constant.

Accordingly, when the delay unit 132 increases the amount of delay of the feedback signal from "d2" to "d2'", the feedback signal output from the delay unit 132 is a signal delayed by "d2'-d2" with respect to the reference signal. When the delay unit 132 decreases the amount of delay of the feedback signal from "d2" to "d2'", on the other hand, the feedback signal output from the delay unit 132 is a signal advanced by "d2-d2'" with respect to the reference signal. That is, the feedback signal can be delayed in a plus (+) direction on a time axis with respect to the reference signal when the delay unit 132 increases the amount of delay of the feedback signal. On the other hand, the feedback signal can be delayed in a minus (−) direction on the time axis with respect to the reference signal when the delay unit 132 decreases the amount of delay of the feedback signal. In other words, the delay unit 132 controls the delay of the feedback signal with respect to the reference signal.

The error calculation unit 133 calculates, for each of the I signal and the Q signal, an error between the reference signal input from the delay unit 135 (the transmission signal delayed by D=d1+d2) and the feedback signal input from the delay unit 132. The error calculation unit 133 then outputs the calculated error to the distortion compensation coefficient update unit 134.

For each of the I signal and the Q signal, the distortion compensation coefficient update unit 134 uses an LMS (Least Mean Square) algorithm or the like to successively update the coefficients C0 to C4 such that the error calculated by the error calculation unit 133 takes the smallest value. The distortion compensation coefficient update unit 134 sets the updated coefficients C0 to C4 to the predistortion unit 131.

<Example of Configuration of Predistortion Unit>

Figure 2:
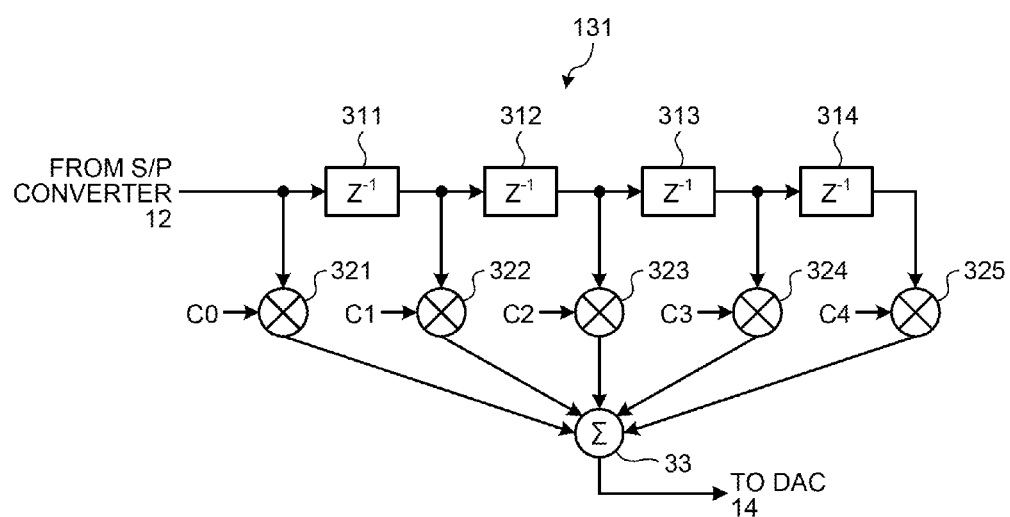
FIG. 2 is a block diagram illustrating an example of a configuration of a predistortion unit according to the first embodiment.

FIG. 2 is a block diagram illustrating an example of a configuration of the predistortion unit according to the first embodiment. As illustrated in FIG. 2, the distortion compensation device 13 includes an FIR filter as the predistortion unit 131. That is, the predistortion unit 131 includes delay elements 311 to 314 each delaying an input signal by one sample, multipliers 321 to 325, and an adder 33.

The distortion compensation coefficient update unit 134 inputs the coefficients C0 to C4 to the multipliers 321 to 325, respectively.

The multiplier 321 multiplies the input signal from the S/P converter 12 and the coefficient C0 together and outputs a multiplication result to the adder 33.

The multiplier 322 multiplies a signal delayed by one sample from the input signal by the delay element 311 and the coefficient C1 together, and outputs a multiplication result to the adder 33.

The multiplier 323 multiplies a signal delayed by two samples from the input signal by the delay elements 311 and 312 and the coefficient C2 together, and outputs a multiplication result to the adder 33.

The multiplier 324 multiplies a signal delayed by three samples from the input signal by the delay elements 311, 312 and 313 and the coefficient C3 together, and outputs a multiplication result to the adder 33.

The multiplier 325 multiplies a signal delayed by four samples from the input signal by the delay elements 311, 312, 313, and 314 and the coefficient C4 together, and outputs a multiplication result to the adder 33.

The adder 33 adds all the multiplication results from the multipliers 321 to 325 to generate a PD signal and outputs the generated PD signal to the DAC 14.

<Operation of Distortion Compensation Device>

The distortion compensation is performed in the distortion compensation device 13 when the delay unit 132 is operated as follows. FIGS. 3 to 6 are graphs used to describe the operation of the distortion compensation device according to the first embodiment.

Figure 3:
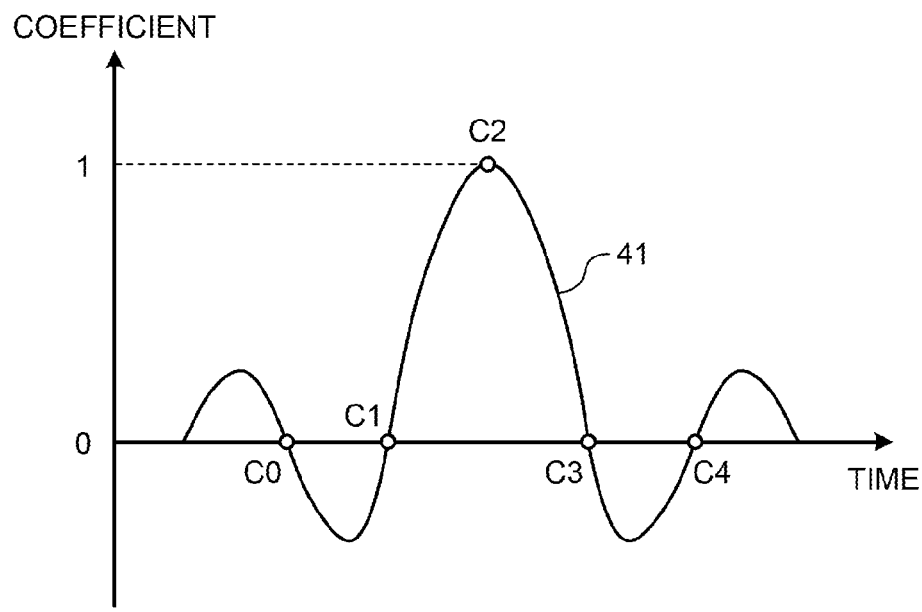
FIG. 3 is a graph used to describe an operation of a distortion compensation device according to the first embodiment.

FIG. 3 illustrates the coefficients C0 to C4 when there is no distortion. The coefficient C2 is a coefficient multiplied in the center tap illustrated in FIG. 2 (hereinafter referred to as a "center tap coefficient" in some cases), where FIG. 3 illustrates the coefficients C0 to C4 with a reference time set to the center tap. Here, each of the coefficients has the value of C2=1 and C0, C1, C3, and C4=0. The coefficients C0 to C4 appear on a graph 41 of a sinc function.

Figure 4:
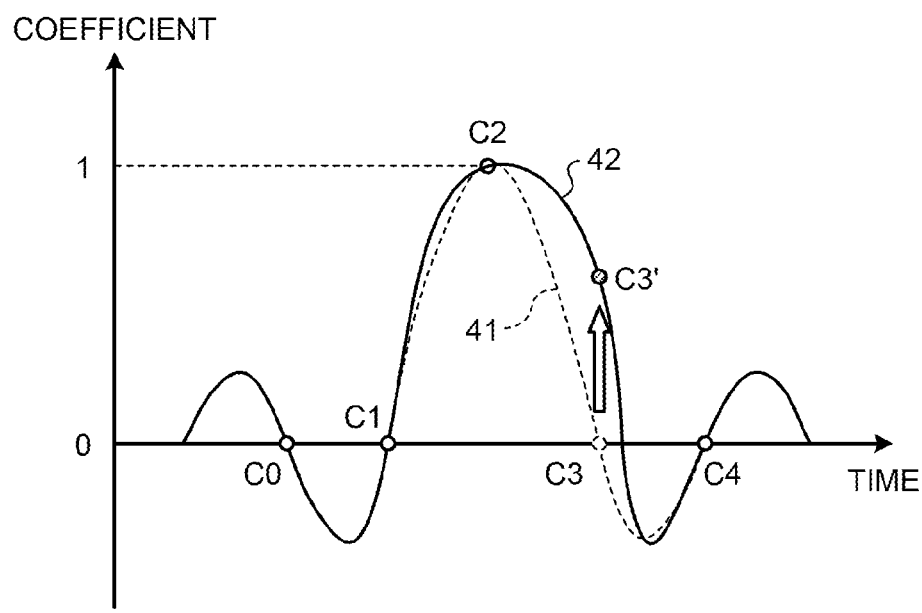
FIG. 4 is a graph used to describe an operation of the distortion compensation device according to the first embodiment.

When a distortion is generated, the coefficient C3 is increased to be updated to a coefficient C3' as illustrated in FIG. 4, for example. It is assumed here that the coefficient C3' is larger than or equal to a threshold. The graph 41 is deformed into a graph 42. At this time, the distortion compensation device 13 is operated as follows. There will now be described two operation examples, operation example 1-1 and operation example 1-2.

<Operation Example 1-1>

The operation example 1-1 is an example suitable for a case where the same number of bits is assigned to all the coefficients C0 to C4.

The delay unit 132 monitors the coefficients C0 to C4 and determines that the coefficient C3 is larger than or equal to the threshold. This threshold preferably takes a value slightly smaller than a coefficient value that can be expressed by the number of bits assigned to each of the coefficients C0 to C4. The threshold is set to a value equal to 95% of the coefficient value that can be expressed by the number of bits assigned to each of the coefficients C0 to C4, for example.

Figure 5:
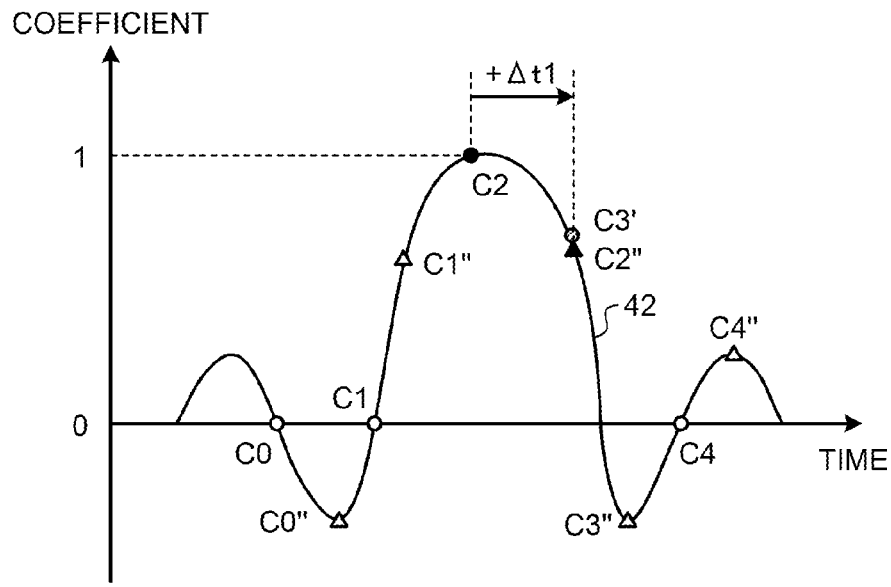
FIG. 5 is a graph used to describe an operation of the distortion compensation device according to the first embodiment.

Here, as illustrated in FIG. 5, the delay unit 132 applies a delay of "d2+Δt1" to the feedback signal in order to decrease the center tap coefficient C2 having the largest value among the coefficients C0 to C4. The error calculated by the error calculation unit 133 therefore includes an error caused by "+Δt1" that is a difference in delay between the reference signal and the feedback signal. The error caused by a delay is also generated by the memory effect of the amplifier 17. That is, the error calculated by the error calculation unit 133 includes the error caused by "+Δt1" as well as the error caused by the memory effect. The distortion compensation coefficient update unit 134 thus treats the error caused by "+Δt1" and the error caused by the memory effect alike, and updates the coefficients C0 to C4.

As a result, the distortion compensation coefficient update unit 134 updates the coefficients C0, C1, C2, C3', and C4 to coefficients C0" to C4" on the graph 42 as illustrated in FIG. 5 upon applying the delay of "d2+Δt1" to the feedback signal by the delay unit 132. As illustrated in FIG. 5, the absolute value of each of the coefficients C0" to C4" is smaller than the absolute value of the coefficient C2, whereby the number of bits smaller than the number of bits capable of expressing the coefficient C2 is sufficient to be able to express each of the coefficients C0" to C4". Moreover, the absolute value of each of the coefficients C0", C1", C3", and C4" is smaller than or equal to the absolute value of the coefficient C2", whereby the number of bits smaller than or equal to the number of bits capable of expressing the coefficient C2" is sufficient to be able to express the coefficients C0", C1", C3", and C4". Therefore, when the same number of bits is assigned to all the coefficients C0 to C4, each of the coefficients C0 to C4 can be expressed by the number of bits smaller than that adopted in the related art by decreasing the center tap coefficient C2 having the largest value among the coefficients C0 to C4 as described above. The number of bits assigned in advance to each of the coefficients C0 to C4 can thus be decreased compared to the number of bits adopted in the related art.

<Operation Example 1-2>

The operation example 1-2 is an example suitable for a case where the number of bits smaller than the number of bits assigned to the center tap coefficient C2 is assigned to each coefficient other than the center tap coefficient C2.

Figure 6:
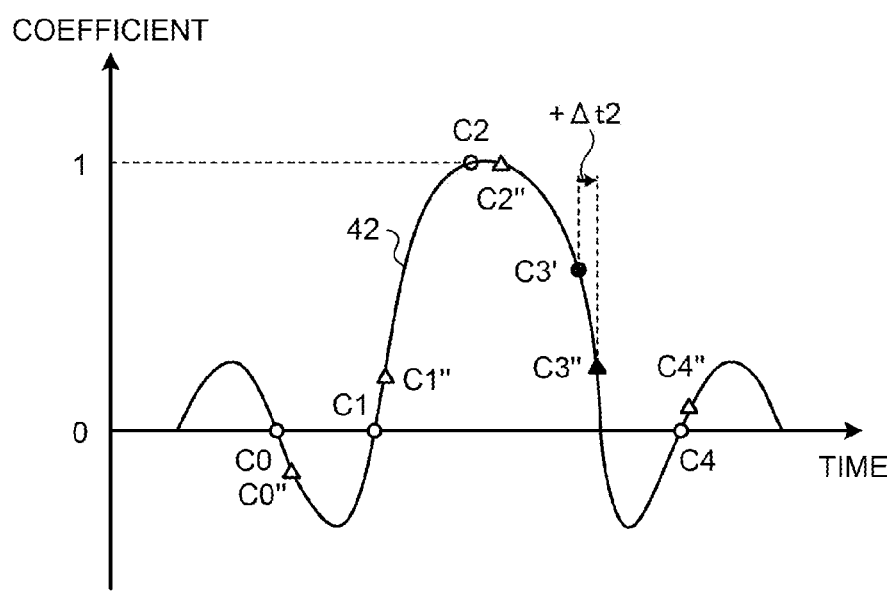
FIG. 6 is a graph used to describe an operation of the distortion compensation device according to the first embodiment.

Similar to the operation example 1-1, the delay unit 132 determines that the coefficient C3 is larger than or equal to a threshold. Here, as illustrated in FIG. 6, the delay unit 132 applies a delay of "d2+Δt2" to the feedback signal in order to decrease the coefficient C3" that is the largest coefficient among the coefficients excluding the center tap coefficient C2. The distortion compensation coefficient update unit 134 thus treats the error caused by "+Δt2" and the error caused by the memory effect alike, and updates the coefficients C0 to C4 as with the operation example 1-1.

That is, the distortion compensation coefficient update unit 134 updates the coefficients C0, C1, C2, C3', and C4 to the coefficients C0" to C4" on the graph 42 as illustrated in FIG. 6 upon applying the delay of "d2+Δt2" to the feedback signal by the delay unit 132. Moreover, as illustrated in FIG. 6, the absolute value of each of the coefficients C0", C1", and C4" is smaller than or equal to the absolute value of the coefficient C3", whereby the number of bits smaller than or equal to the number of bits capable of expressing the coefficient C3" is sufficient to be able to express the coefficients C0", C1", and C4". As a result, each of the coefficients excluding the center tap coefficient can be expressed by the number of bits smaller than that adopted in the related art by decreasing the coefficient having the largest value among the coefficients excluding the center tap coefficient. The number of bits assigned in advance to each coefficient excluding the center tap coefficient can thus be decreased compared to the number of bits adopted in the related art.

<Processing Performed by Distortion Compensation Device>

Figure 7:
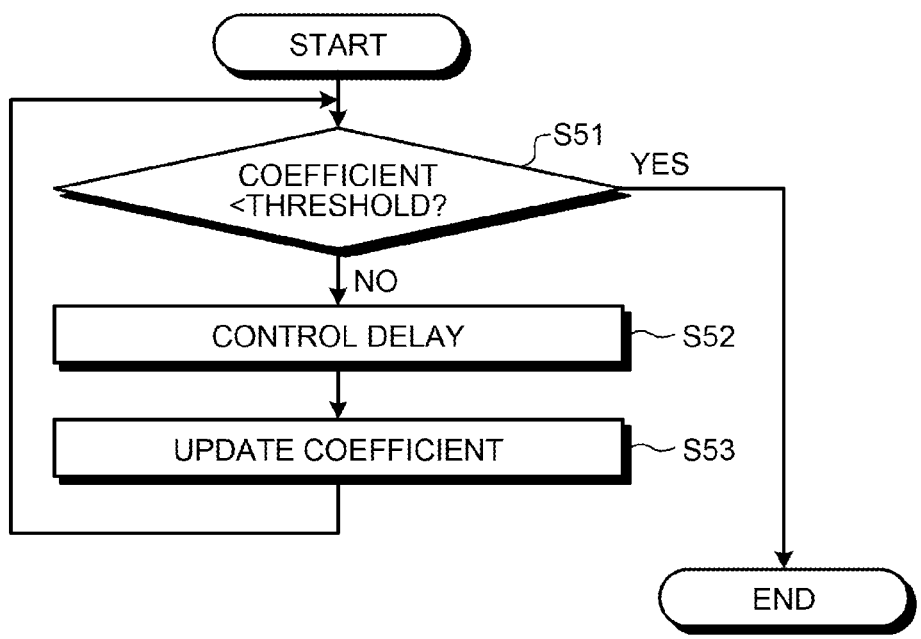
FIG. 7 is a flowchart used to describe processing performed by the distortion compensation device according to the first embodiment.

FIG. 7 is a flowchart used to describe processing performed by the distortion compensation device according to the first embodiment. The flowchart illustrated in FIG. 7 is started at a predetermined timing or every fixed time.

The delay unit 132 determines whether or not all coefficients to be monitored are smaller than a threshold (step S51). All the coefficients C0, C1, C3, and C4 excluding the center tap coefficient C2 are determined as the coefficients to be monitored.

The processing in the flowchart ends when all the coefficients to be monitored are smaller than the threshold (step S51: Yes).

When any of the coefficients to be monitored is larger than or equal to the threshold (step S51: No), on the other hand, the delay unit 132 controls the delay of the feedback signal and increases or decreases the amount of delay applied to the feedback signal (step S52). That is, in step S52, the delay unit 132 changes the amount of delay applied to the feedback signal.

The delay of the feedback signal is controlled in step S52, so that the distortion compensation coefficient update unit 134 treats the error caused by the difference in delay between the reference signal and the feedback signal and the error caused by the delay resulting from the memory effect alike, and updates the coefficient (step S53).

The processing returns to step S51 after performing the processing in step S53. In other words, the processing performed in steps S52 and S53 is repeated until all the coefficients to be monitored are smaller than the threshold.

In the present embodiment, as described above, the distortion compensation device 13 which compensates for the distortion of the amplifier 17 includes the FIR filter serving as the predistortion unit 131, the error calculation unit 133, the distortion compensation coefficient update unit 134, and the delay unit 132. The error calculation unit 133 calculates the error between the reference signal and the feedback signal. The distortion compensation coefficient update unit 134 updates the coefficient set to the FIR filter on the basis of the error between the reference signal and the feedback signal. The delay unit 132 controls the delay of the feedback signal with respect to the reference signal on the basis of the magnitude of the coefficient set to the FIR filter.

As a result, each coefficient is updated such that the absolute value thereof is decreased, whereby each coefficient can be expressed by the number of bits smaller than that adopted in the related art. The number of bits assigned in advance to each coefficient can thus be decreased compared to the number of bits adopted in the related art, whereby the circuit in the distortion compensation device 13 can be decreased in scale.

Moreover, the delay unit 132 changes the amount of delay applied to the feedback signal when the coefficient is larger than or equal to the threshold.

This can prevent the coefficient from being clipped to the maximum value or the minimum value that can be expressed by the number of bits assigned in advance to that coefficient. The degradation in the distortion compensation characteristic caused by clipping can be prevented as a result.

[b] Second Embodiment

<Operation of Distortion Compensation Device>

Figure 8:
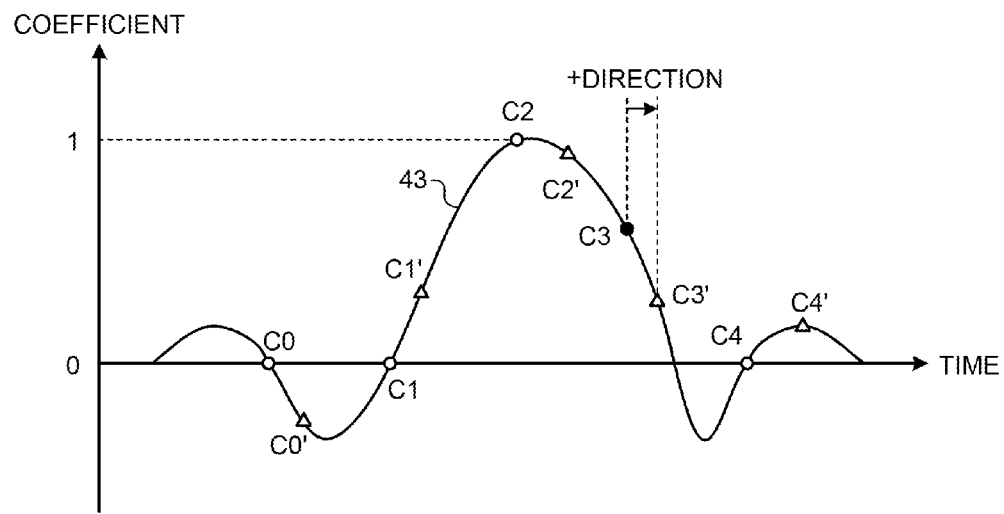
FIG. 8 is a graph used to describe an operation of a distortion compensation device according to a second embodiment.
Figure 9:
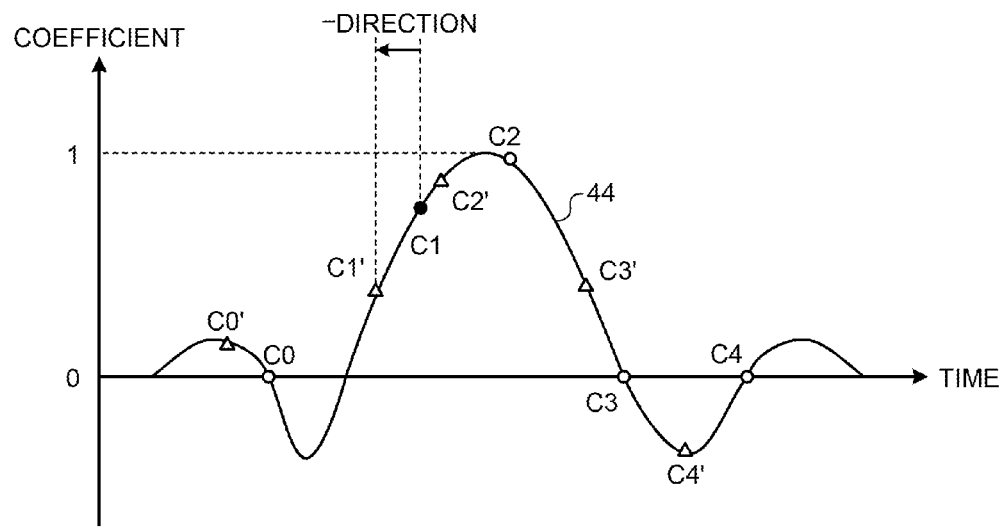
FIG. 9 is a graph used to describe an operation of the distortion compensation device according to the second embodiment.

An example of a configuration of a wireless transmission apparatus according to the present embodiment is similar to that of the first embodiment, and thus there will be described below an operation of a distortion compensation device according to the present embodiment with reference to FIGS. 8 and 9. FIGS. 8 and 9 are graphs each used to describe the operation of the distortion compensation device according to a second embodiment.

Similar to the graph 42, a graph 43 illustrated in FIG. 8 is a graph deformed from the graph 41 of a sinc function following the update of a coefficient C3. It is assumed that the coefficient C3 is larger than or equal to a threshold. At this time, one can see from the shape of the graph 43 that a delay of a feedback signal with respect to a reference signal may be applied in a plus (+) direction on a time axis in order to decrease the coefficient C3. In other words, one can see that the feedback signal may be delayed temporally with respect to the reference signal. That is, a delay unit 132 may increase a current amount of delay applied to the feedback signal in order to decrease the coefficient C3. Accordingly, the delay unit 132 increases the amount of delay applied to the feedback signal when the coefficient C3 is in the state illustrated in FIG. 8. Coefficients C0 to C4 are thus updated to coefficients C0' to C4' on the graph 43, where the coefficient C3' is smaller than the coefficient C3.

Moreover, a graph 44 illustrated in FIG. 9 is a graph deformed from the graph 41 of a sinc function following the update of the coefficient C1 similar to the graphs 42 and 43. It is assumed that the coefficient C1 is larger than or equal to a threshold. At this time, one can see from the shape of the graph 44 that a delay of the feedback signal with respect to the reference signal may be applied in a minus (−) direction on the time axis in order to decrease the coefficient C1. In other words, one can see that the feedback signal may be advanced temporally with respect to the reference signal. That is, the delay unit 132 may decrease the current amount of delay applied to the feedback signal in order to decrease the coefficient C1. Accordingly, the delay unit 132 decreases the amount of delay applied to the feedback signal when the coefficient C1 is in the state illustrated in FIG. 9. The coefficients C0 to C4 are thus updated to the coefficients C0' to C4' on the graph 44, where the coefficient C1' is smaller than the coefficient C1.

<Processing Performed by Distortion Compensation Device>

Figure 10:
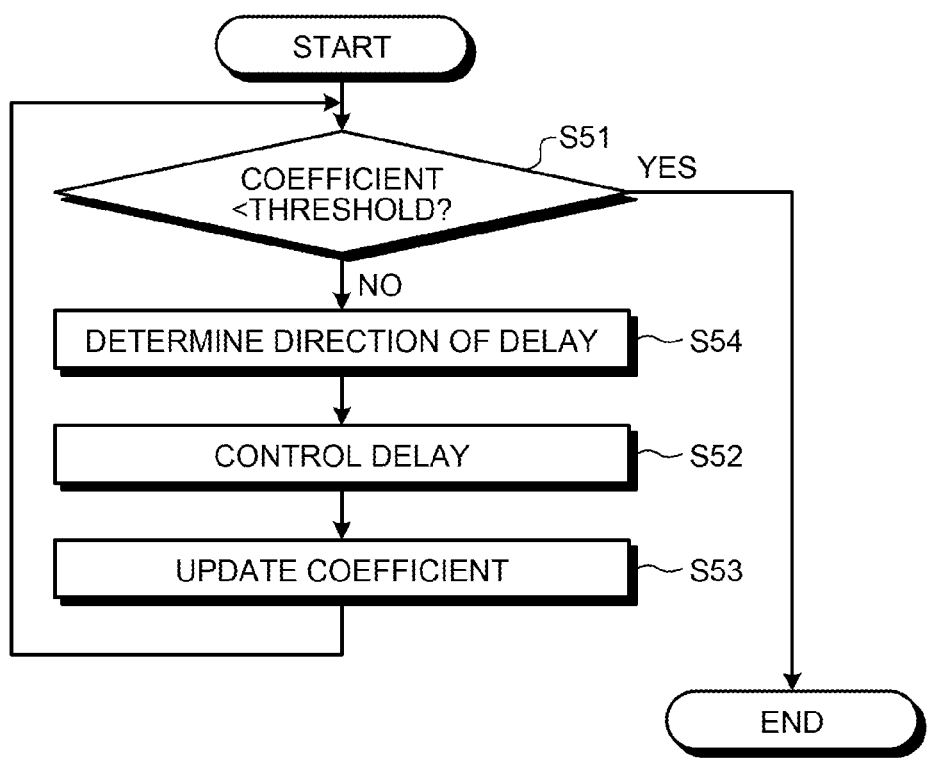
FIG. 10 is a flowchart used to describe processing performed by the distortion compensation device according to the second embodiment.

FIG. 10 is a flowchart used to describe processing performed by the distortion compensation device according to the second embodiment. The flowchart illustrated in FIG. 10 is started at a predetermined timing or every fixed time.

When any of coefficients to be monitored is larger than or equal to a threshold (step S51: No), the delay unit 132 determines the direction, on the time axis, of the delay of the feedback signal with respect to the reference signal as described above (step S54).

In step S52, the delay unit 132 increases or decreases the amount of delay applied to the feedback signal according to the direction determined in step S54.

In the present embodiment, as described above, the delay unit 132 determines the direction of the delay of the feedback signal with respect to the reference signal on the time axis on the basis of the shape of the graphs 43 and 44 that are deformed from the graph 41 of the sinc function following the update of the coefficient.

As a result, the coefficient larger than or equal to the threshold can surely be decreased to a value smaller than the threshold by the delay control performed by the delay unit 132.

The first and second embodiments have been described above.

[c] Other Embodiments

[1] The technique disclosed herein can be applied to various compensation devices using an FIR filter. The technique disclosed herein can be applied to a compensation device which compensates for a phase distortion by using the FIR filter and a compensation device which compensates for a frequency deviation by using the FIR filter, for example.

[2] A distortion compensation device 13 is realized as hardware by an FPGA (Field Programmable Gate Array), an LSI (Large Scale Integrated circuit), or a processor, for example. A baseband unit 11 and an S/P converter 12 are also realized as hardware by the FPGA, LSI, or processor. A CPU (Central Processing Unit) and a DSP (Digital Signal Processor) are examples of the processor. Moreover, a DAC 14, a quadrature modulator 15, a carrier wave generator 16, an amplifier 17, a coupler 18, an antenna 19, a quadrature demodulator 20, and an ADC 21 are realized as hardware by a wireless communication module. A wireless transmission apparatus 10 and the distortion compensation device 13 may include a memory.

The circuit in the distortion compensation device can be decreased in scale according to the embodiments disclosed herein.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensation device which compensates for a distortion of an amplifier, the distortion compensation device comprising:
    a Finite Impulse Response (FIR) filter;
    a calculation unit that calculates an error between a reference signal and a feedback signal from the amplifier;
    an update unit that updates a coefficient set to the FIR filter on the basis of the error; and
    a delay unit that, on the basis of a magnitude of the coefficient, delays the feedback signal while controlling a delay of the feedback signal with respect to the reference signal.

2. The distortion compensation device according to claim 1, wherein the delay unit changes an amount of delay applied to the feedback signal when the coefficient is larger than or equal to a threshold.

3. The distortion compensation device according to claim 1, wherein the delay unit determines a direction, on a time axis, of the delay of the feedback signal with respect to the reference signal on the basis of a shape of a graph deformed from a graph of a sinc function following the update of the coefficient.

4. A distortion compensation method which compensates for a distortion of an amplifier by using a Finite Impulse Response (FIR) filter, the distortion compensation method comprising:
    calculating an error between a reference signal and a feedback signal from the amplifier;
    updating a coefficient set to the FIR filter on the basis of the error; and
    on the basis of a magnitude of the coefficient, delaying the feedback signal while controlling a delay of the feedback signal with respect to the reference signal.

* * * * *